United States Patent
Chang et al.

(10) Patent No.: US 7,525,827 B2
(45) Date of Patent: Apr. 28, 2009

(54) STORED DON'T-CARE BASED HIERARCHICAL SEARCH-LINE SCHEME

(75) Inventors: Shu-Wei Chang, Sinjhuang (TW); Wei Hwang, La Verne, CA (US); Ming-Hung Chang, Hsinchu (TW); Po-Tsang Huang, Yingge Township, Taipei County (TW)

(73) Assignee: National Chiao Tung University, Hsinchu (TW)

( * ) Notice: Subject to any disclaimer, the term of this patent is extended or adjusted under 35 U.S.C. 154(b) by 16 days.

(21) Appl. No.: 11/675,386

(22) Filed: Feb. 15, 2007

(65) Prior Publication Data
US 2008/0175030 A1 Jul. 24, 2008

(30) Foreign Application Priority Data
Jan. 19, 2007 (TW) .............................. 96102120 A

(51) Int. Cl.
*G11C 15/00* (2006.01)
(52) U.S. Cl. .................. 365/49.1; 365/49.16; 365/49.17
(58) Field of Classification Search ................ 365/49.1, 365/49.11, 49.12, 49.13, 49.15, 49.16, 49.17, 365/49.18, 50
See application file for complete search history.

(56) References Cited

U.S. PATENT DOCUMENTS

| | | | | |
|---|---|---|---|---|
| 5,239,642 A * | 8/1993 | Gutierrez et al. | ......... | 365/49.17 |
| 6,430,073 B1 * | 8/2002 | Batson et al. | ............... | 365/49.1 |
| 6,487,101 B1 * | 11/2002 | Ashbrook et al. | ........ | 365/49.17 |
| 6,665,220 B2 * | 12/2003 | Vlasenko | ................. | 365/49.17 |
| 6,836,419 B2 * | 12/2004 | Loughmiller | ............. | 365/49.12 |
| 7,043,601 B2 * | 5/2006 | McKenzie et al. | ........ | 365/49.18 |
| 7,167,385 B2 * | 1/2007 | Chan et al. | ................ | 365/49.12 |
| 7,233,512 B2 * | 6/2007 | Lysinger et al. | ............ | 365/49.1 |
| 7,259,979 B2 * | 8/2007 | Sachan et al. | ............. | 365/49.15 |
| 7,274,581 B1 * | 9/2007 | Powell et al. | ............. | 365/49.16 |
| 2008/0062804 A1 * | 3/2008 | Wang | | |

OTHER PUBLICATIONS

Hideyuki Noda, et al, A Cost-Efficient High-Performance Dynamic TCAM With Pipelined Hierarchical Searching And Shift Redundancy Architecture, IEEE, vol. 40 No. 1, Jan. 2005.
Jinn-Shyan Wang, et al, TCAM For IP-Address Lookup Using Tree-Style And-Type Match Lines And Segmented Search Lines, IEEE International Solid-State Circuits Conference, pp. 166-167, Feb. 2006.

* cited by examiner

*Primary Examiner*—Trong Phan
(74) *Attorney, Agent, or Firm*—Ming Chow; Sinorica, LLC

(57) ABSTRACT

In the proposed stored don't-care hierarchical search-line scheme, a content-addressable memory (CAM) is divided into several blocks. Each block contains a plurality of local search-lines, a global search-line, a buffer and a memory memory cell. Data are stored in the blocks in order according to the length of the prefix. Data with the longest prefix is stored at the bottommost, and its don't-care state is used as the control signal of the buffer to control whether to transfer the data on the global search-line to the local search-line or not. The local search-line then transfer the value into the memory cell. There is no complex control circuit and extra storage device needed. Moreover, because the control signal directly comes from the don't-care state, power consumption on search-lines can be effectively reduced with no increase of search delay.

11 Claims, 5 Drawing Sheets

STORED DON'T-CARE BASED HIERARCHICAL SEARCH-LINE SCHEME

BACKGROUND OF THE INVENTION

1. Field of the Invention

The present invention relates to a design of search-line in the computer network domain and, more particularly, to a stored don't-care based hierarchical search-line scheme making use of a content-addressable memory (CAM) to apply to IP addressing lookup.

2. Description of Related art

Content-addressable memory (CAM) is a memory that implements the lookup-table function in a single clock cycle using dedicated comparison circuitry. CAM is a high performance search engine. It compares input search data with its entire contents within a single clock cycle. A CAM cell serves two basic functions—bit storage and bit comparison. For bit storage, CAM plays as an ordinary memory. Different from the SRAM, CAM has a special mode—searching operation. High search speed is the most advantage of CAM. As CAM applications grow, the power problem deteriorates more than the area. How to make a trade-off between power, speed, and area is the most important issue of recent researches in large capacity CAMs.

CAM can be classified into binary CAM and ternary CAM. The binary CAM cell, has two states: "one" state and "zero" state. Different from binary CAM cell, the ternary CAM has an extra state, don't-care, which is suitable to be used in network applications. Because ternary CAM cell has this extra state, it needs an additional storage memory to store data.

FIG. 1 shows a simplified block diagram of a ternary CAM. A conventional Ternary CAM architecture is usually composed of memory cell array 32, address decoders 30, bit-lines pre-charge circuits 38, word match schemes 34, read sense amplifiers 42, address priority encoders 36 and data line 40. Generally, ternary CAM has three operation modes: write, read, and search. The input in FIG. 1 is called search word that is broadcasted onto the search-lines. The number of bits in a ternary CAM word is usually large, with existing implementations ranging from 36 to 144 bits. A typical ternary CAM employs a table size ranging between a few hundred entries to 32K entries, corresponding to an address space ranging from 7 bits to 15 bits. Each stored word has a match-line that indicates whether the search word and stored word are identical (the match case) or are different (a mismatch case, or miss). The match-lines are fed to an encoder that generates a binary match location corresponding to the match-line that is in the match state. An encoder is used in systems where only a single match is expected. In ternary CAM applications where more than one word may match, a priority encoder is used instead of a simple encoder. An address priority encoder 36 selects the highest priority matching location to map to the match result, with words in lower address locations receiving higher priority. The overall function of a ternary CAM is to take a search word and return the matching memory location.

The hierarchical search-line scheme divides the search-lines into a two-level hierarchy of global search-lines (GSLs) and local search-lines (LSLs). FIG. 2 shows a simplified hierarchical search-line scheme, where the match-lines are pipelined into two segments, and the search-lines are divided into four LSLs per GSL. As shown in FIG. 2, hierarchical search-lines are built on top of pipelined match-lines. The basic idea of hierarchical search-lines is to exploit the fact that few match-lines survive the first segment of the pipelined match-lines. In the figure, each LSL feeds only a single match-line (for simplicity), but the number of match-lines per LSL can be 64 to 256. The GSLs are active every cycle, but the LSLs are active only when necessary. Activating LSLs is necessary only when at least one of the match-lines fed by the LSL is active. In many cases, an LSL will have no active match-lines in a given cycle, hence there is no need to activate the LSL, saving power.

However, the search speed is also restricted by hierarchical search-line (HSL) scheme. The primary reason is that the control signal comes from the comparison result at the previous stage in the same block, causing search time delay because each stage has to await the previous stage to finish operations and await the logic gate delay on one stage of HSL to start the comparison. Besides, in order to get the control signal of the next stage, the buffer of the HSL needs to have a very large control logic gate, in which the area and power overhead caused by the pipeline flip-flops and the clock driver diminishes the usefulness of the approach.

Accordingly, the present invention aims to propose a stored don't-care based hierarchical search-line scheme to solve the above drawbacks in the prior art.

SUMMARY OF THE INVENTION

An object of the present invention is to provide a stored don't-care based hierarchical search-line scheme, which is used in a CAM to arrange data in a special manner and to directly compare data having the longest prefix so as to determine whether it is a don't-care. If the answer is yes, data with shorter prefixes are also don't-cares.

Another object of the present invention is to provide a stored don't-care based hierarchical search-line scheme, in which data having the longest prefix is stored at the bottom of the memory cell in order of prefix length, and data search is performed upward from the bottom.

Another object of the present invention is to provide a stored don't-care based hierarchical search-line scheme, in which the data content of the bottom of each block is used as the control signal of the buffer. Therefore, the value of this control signal can be immediately known at write cycle, and no time delay will occur during search.

Another object of the present invention is to provide a stored don't-care based hierarchical search-line scheme, which directly makes use of the arrangement characteristic of don't-care to control HSLs without the need of extra storage unit in the applications of IP addressing lookup.

Another object of the present invention is to provide a stored don't-care based hierarchical search-line scheme, in which HSLs are divided into GSLs and LSLs. The GSLs are active for every search. If the state of each CAM cell connected to the LSLs is don't-care, the LSLs will be turned off to save power consumption.

To achieve the above objects, the present invention provides a stored don't-care based hierarchical search-line scheme, which is used in a CAM. The stored don't-care based hierarchical search-line scheme comprises a plurality of blocks, a plurality of hierarchical search-line groups and a plurality of buffers. The blocks are divided from the content-addressable memory. Each block contains a memory cell, and stores a plurality of defined don't-care states. The HSL groups are disposed in the blocks. Each HSL group includes a GSL and a LSL. The LSL is connected to the memory cell. Each block searches synchronously the don't-cares. Each buffer is disposed in one of the blocks and connected to the GSL and the LSL. Whether to transfer data on the GSL to the LSL or not is determined based on the don't-care state.

The present invention also provides a method of using a HSL scheme for search. The method is used in a CAM, which is divided into a plurality of blocks. Each block includes a HSL group. Each HSL group has a GSL and a LSL connected together via a buffer. Each block contains a plurality of defined don't-cares. The method comprises the steps of: storing data of the CAM in the block in order according to the length of its prefix, and sending data for comparison to the GSL; each block synchronously determining whether the data with the longest prefix is a don't-care to provide for said buffer to determine whether to transfer data of the GSL to the LSL according to don't-care state, the buffer also outputting a search value of the LSL; and the LSL sending out the search value.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

The present invention provides a stored don't-care based hierarchical search-line scheme, which makes use of the characteristics of CAM and don't-cares when applied to IP addressing lookup. Using the present invention, the control signal won't increase the search delay, and there is no complex control circuit and extra storage device needed. Power consumption on the search-lines can be effectively reduced while keeping the same search delay, and the area can be saved.

Figure 1:
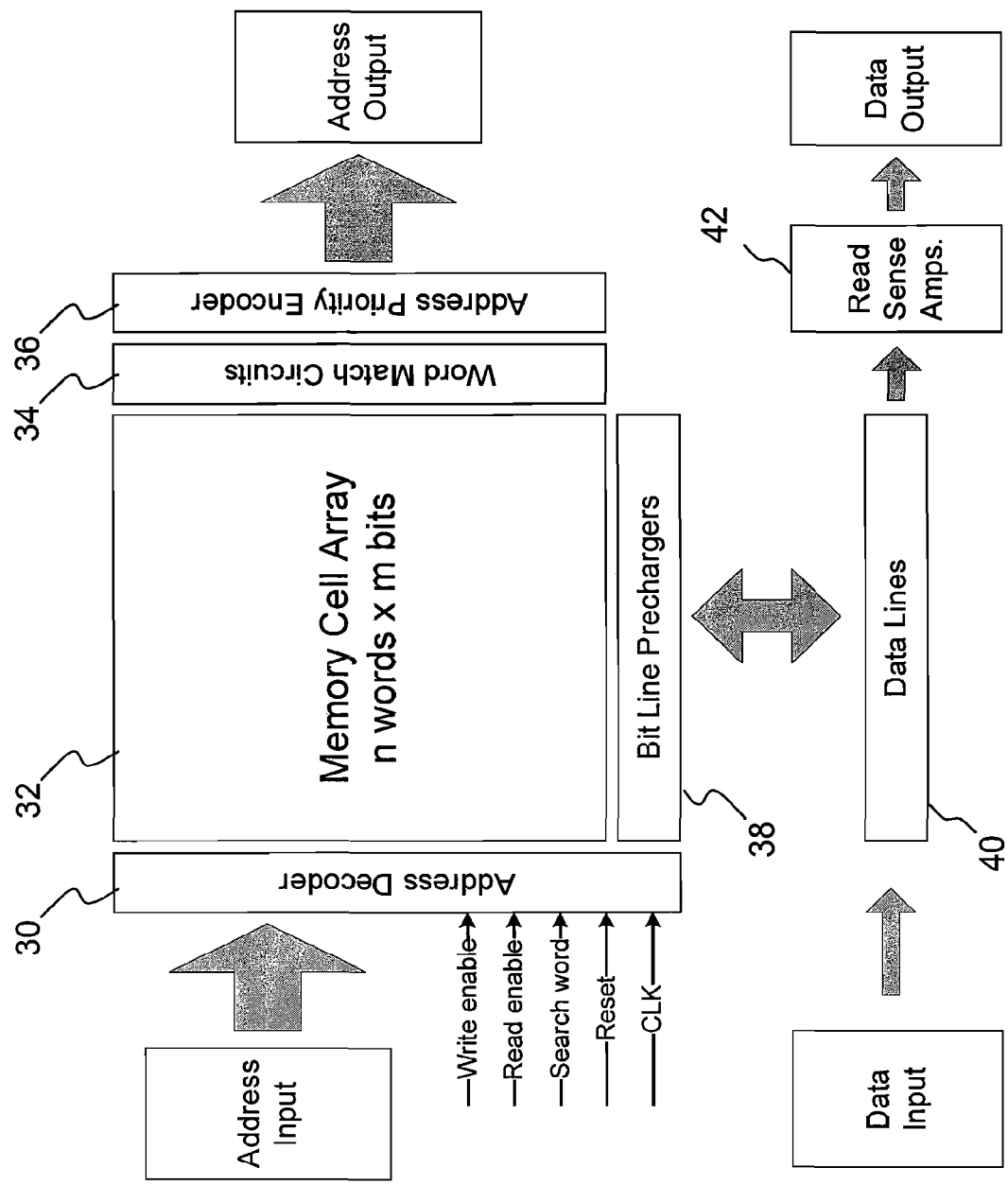
FIG. 1 is a diagram of a conventional ternary content-addressable memory (TCAM) architecture.
Figure 2:
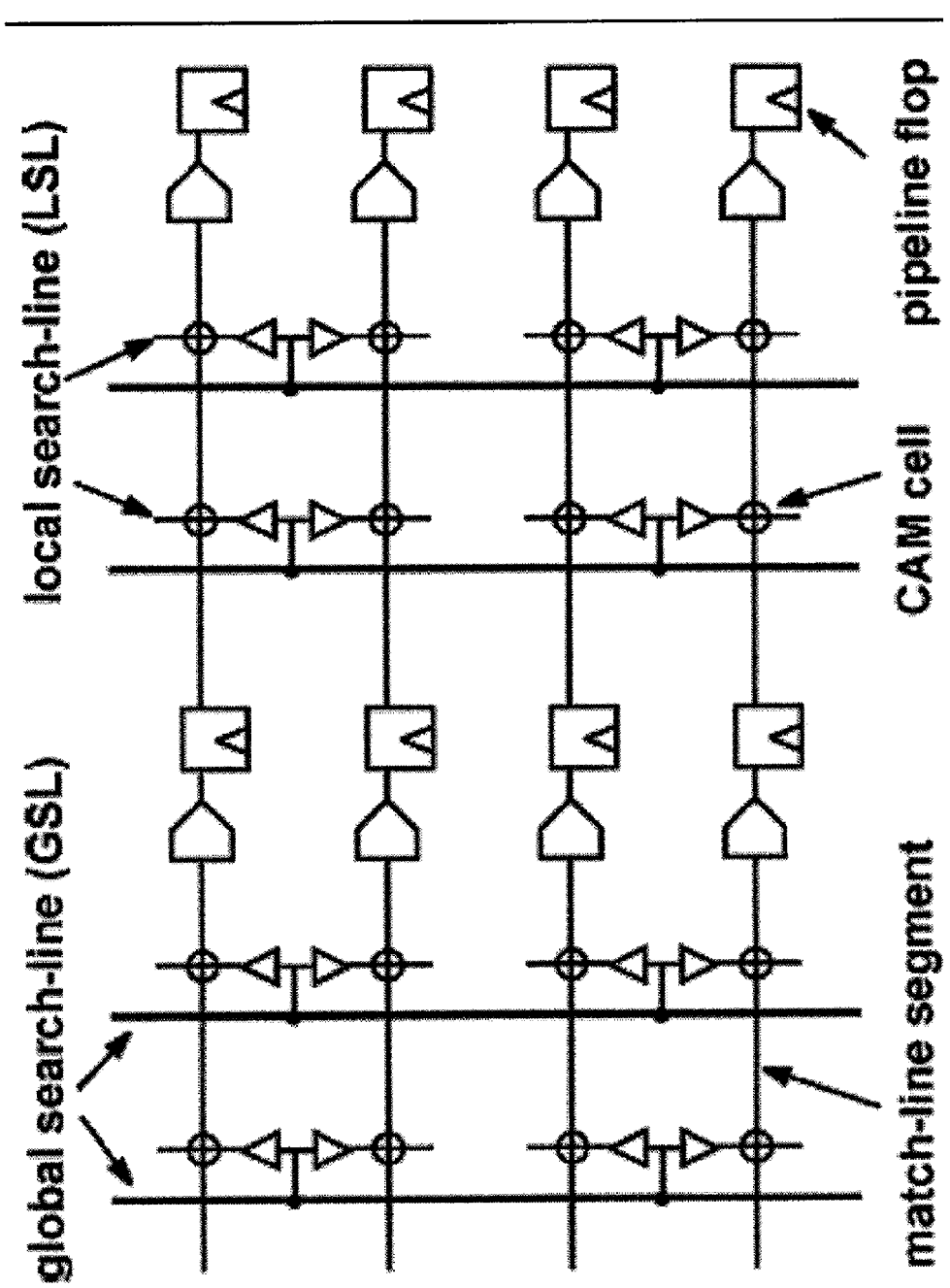
FIG. 2 is a schematic of a conventional hierarchical search-line architecture.
Figure 3:
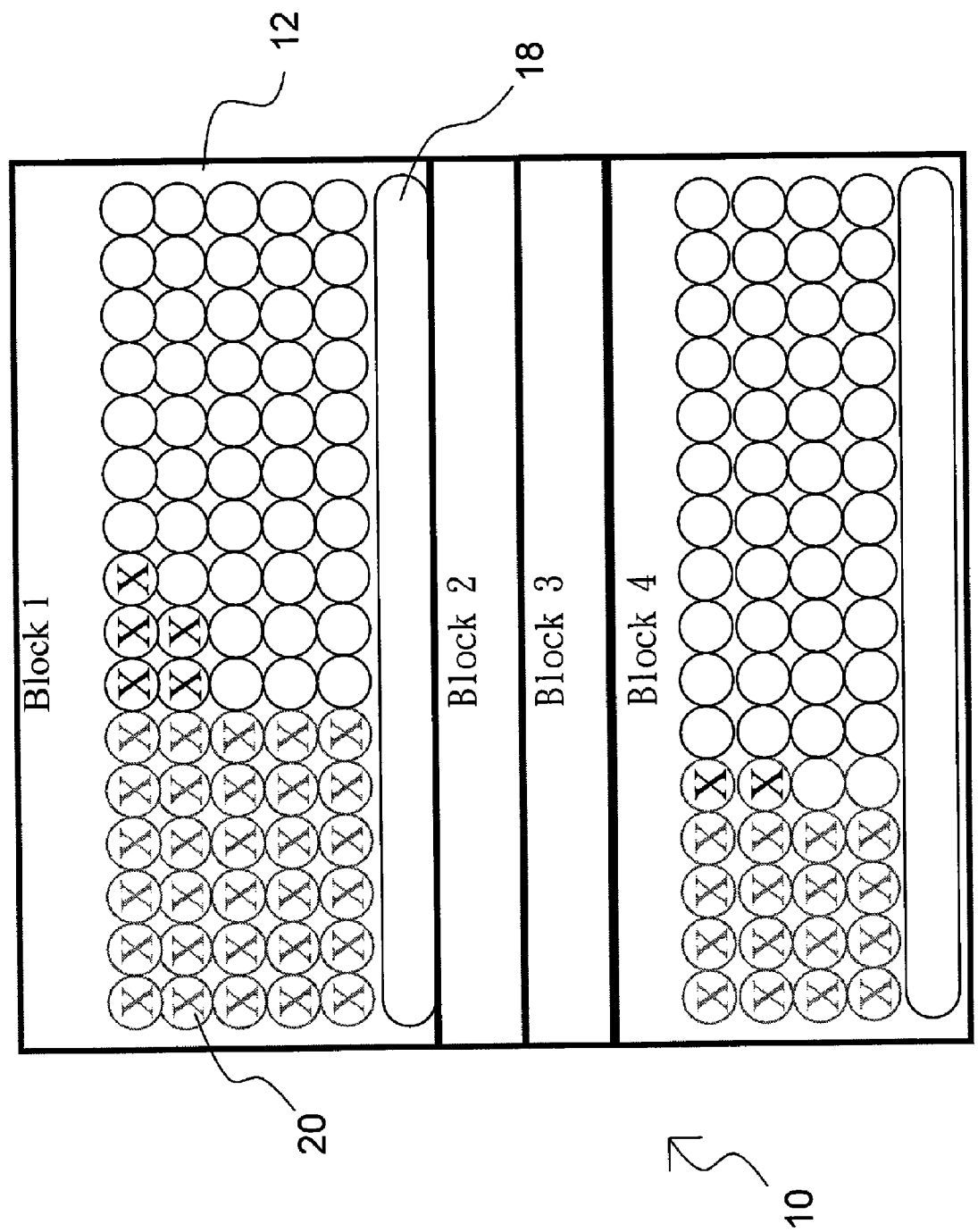
FIG. 3 is a diagram of the don't-care based hierarchical search-line scheme of the present invention.
Figure 4:
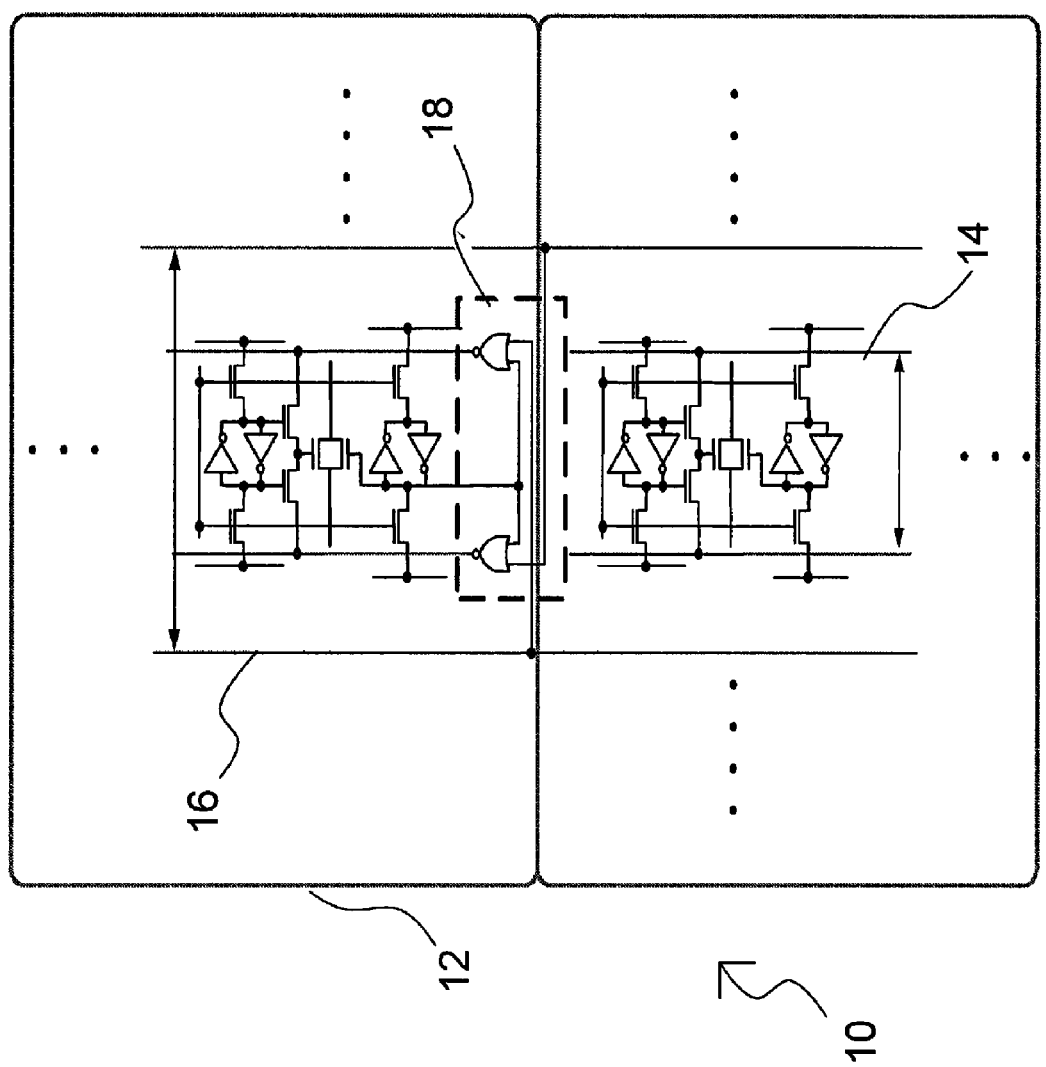
FIG. 4 is a simplified circuit diagram of the don't-care based hierarchical search-line scheme of the present invention.

If the CAM cell is don't-care, the matching signal is independent of input search data. In this situation, search-line can be disabled to save power. To archive this goal, the present invention divides search-line into global search-line (GSL) and local search-line (LSL). A simplified architecture of proposed don't-care based hierarchical search-line scheme is shown in FIG. 3, and a simplified circuit diagram of the present invention is shown in FIG. 4. The entire CAM 10 is divided into a plurality of blocks 12. Each block 12 consists of several math-lines, one LSL 14, one GSL 16 and a buffer 18. The buffer 18 is constructed by NOR gate, and is used to connect the GSL 16 and the LSL 14. In each search, data for comparison is first transferred to the GSL 16, and the buffer 18 decides whether search data on the GSL 16 will broadcast to the LSL 14 or not according to the don't-care state in the CAM 10. The CAM used in the present invention is a ternary CAM.

For IPv6 addressing lookup application using CAM, data is sorted in order of prefix length. Taking FIG. 3 for example, the CAM 10 stores data of 256 bits, each of the four blocks 12 stores data of 64 bits, and whether each piece of data is a don't-care has been defined. Each circle in the blocks 12 represents a memory cell 20. A light-color X in the circle represents don't-care, while a deep-color X in the circle represents a dependent term. In the figure, the longest prefix is located at the bottom of the CAM, i.e., the top of the first block. On the contrary, the shortest prefix is located at the top of the CAM 10, i.e., the bottom of the fourth block. Because each block 12 has a buffer 18, the blocks 12 can search synchronously.

Because data is stored in the blocks 12 in the CAM 10 according to the length of its prefix, if the data having the longest prefix is determined to be a don't-care, data in the upper CAM cell 20 is certainly don't-care. The present invention uses the don't-care state stored in the CAM 10 as the control signal source of the buffer 18. By the special arrangement of data, the don't-care state stored in the bottom CAM word in each block is used as the control signal to provide for the buffer 18 to decide whether search data on GSL 16 will broadcast to the LSL 14 or not. The buffer 18 accepts the input of the GSL 16 and the don't-care state, and outputs a search value of the LSL 14. The LSL 14 finally sends the search value into the memory cell 20 in the block 12.

Figure 5:
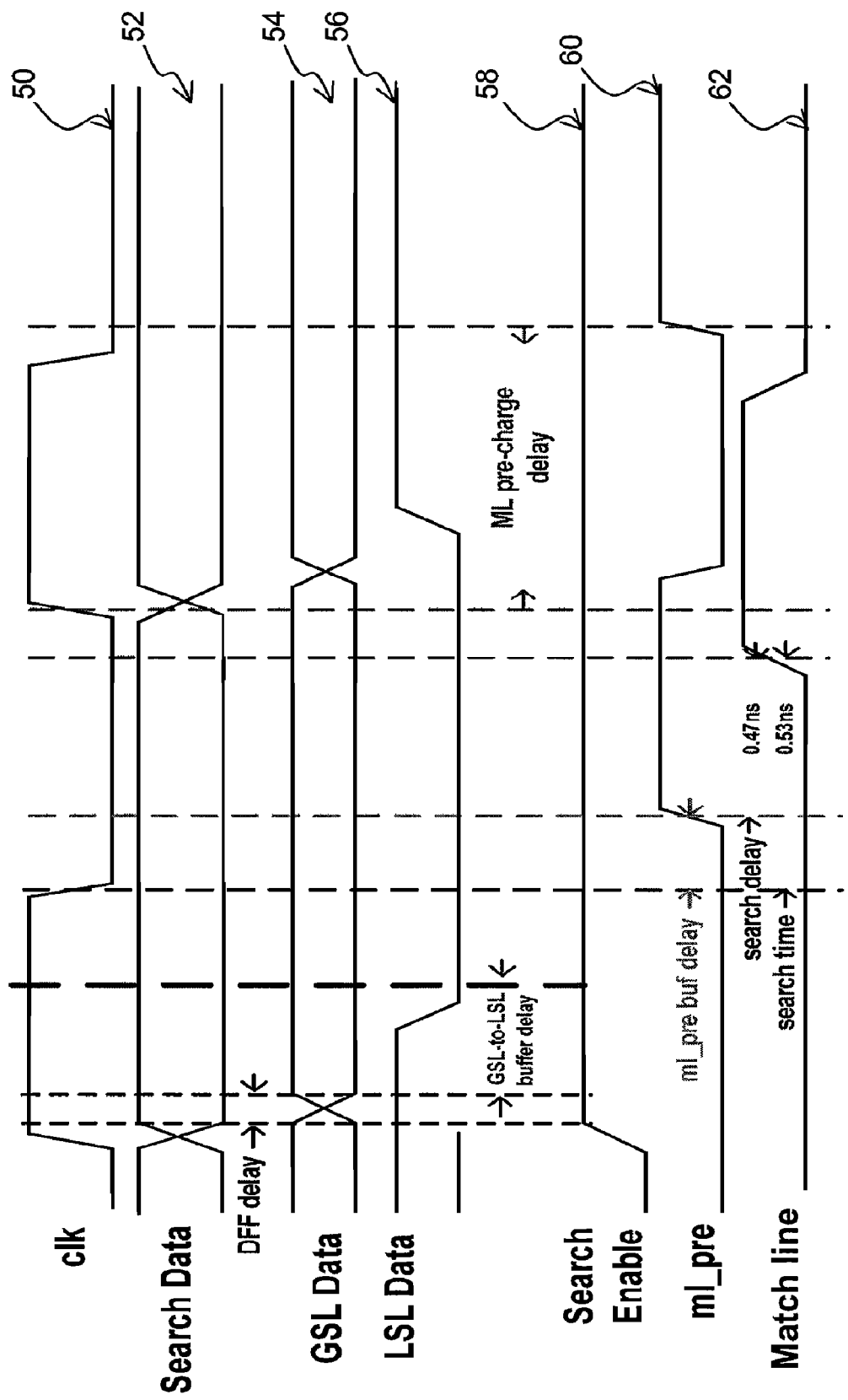
FIG. 5 shows a timing analysis of the don't-care based hierarchical search-line scheme of the present invention.

Another advantage of the present invention compared to the conventional hierarchical search-line scheme is that the don't-care based hierarchical search-line scheme do not increase search delay. FIG. 5 shows the timing diagram of the don't-care based hierarchical search-line scheme. FIG. 5 comprises clock cycle signal 50, search data signal 52, GSL data signal 54, LSL data signal 56, search enable time 58, match line precharge time 60 and match line (ML) 62.Since the control signal of the buffer can be decided in write operation, the buffer won't affect the search delay. It is obviously that GSL-to-LSL delay is shorter than half clock cycle. During operation, search data is already on the LSL. Hence, the architecture proposed by the present invention has no load to search delay.

To sum up, in the stored don't-care based hierarchical search-line scheme provided by the present invention, a CAM is divided into a plurality of blocks, and each block contains a buffer. Using don't-care state that can be decided in write operation as the control signal of the buffer, the search delay won't be affected. Moreover, there is no extra storage device and complex control circuit needed for getting the control signal of next stage as in the prior art. Besides, because the buffer in the present invention is constructed by NOR, the area and power consumption of the buffer can be reduced to achieve better performance of search-line.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A stored don't-care based hierarchical search-line scheme used in a content-addressable memory comprising:

a plurality of blocks divided from said content-addressable memory, each said block containing a memory cell and storing a plurality of don't cares which have defined don't-care states;

a plurality of hierarchical search-line groups disposed in said blocks, each said hierarchical search-line group including a global search-line and a local search-line, said local search-line being connected to said memory cell, each said block searching synchronously said don't-cares;

a plurality of buffers, each said buffer being disposed in one of said block and connected to said global search-line and said local search-line, said don't-care state being based to determine whether to transfer data on said global search-line to said local search-line or not;

data of said content-addressable memory are stored in order in said block according to length of prefix of the data;

all said local search-lines in a same column of said blocks are connected to a common global search-line, and input search data are sent to said global search-line at every search cycle; and said don't-cares are data stored at top of said memory cell in each said block.

2. The stored don't-care based hierarchical search-line scheme according to claim 1, wherein each said hierarchical search-line group is connected to a same column of same said block.

3. The stored don't-care based hierarchical search-line scheme according to claim 1, wherein said local search-line is used to transfer a search value to said memory cell of said block.

4. The stored don't-care based hierarchical search-line scheme according to claim 1, wherein each said block has one said hierarchical search-line group.

5. The stored don't-care based hierarchical search-line scheme according to claim 1, wherein said buffer accepts an input of said global search-line and said don't-care state, and outputs a value on said local search-line.

6. The stored don't-care based hierarchical search-line scheme according to claim 1, wherein said buffer is constructed by NOR gate.

7. A method of using a hierarchical search-line scheme for search, said method being used in a content-addressable memory, said content-addressable memory being divided into a plurality of blocks, each said block including a hierarchical search-line group, each said hierarchical search-line group having a global search-line and a local search-line connected together via a buffer, each said block containing a plurality of defined don't-cares, said method comprising the steps of:

storing data of said content-addressable memory in said block in order according to a length of prefix of the data, and sending data for comparison to said global search-line;

each said block synchronously determining whether the data with a longest prefix is a don't-care to provide for said buffer to determine whether to transfer data of said global search-line into said local search-line according to a state of said don't-care, said buffer also outputting a search value of said local search-line;

said local search-line sending out said search value; and all said local search-lines in a same column are connected to a common global search-line, and input search data are sent to said global search-line at every search cycle;

said buffer accepts an input of said global search-line and said don't-care state, and outputs a value on said local search-line; and said don't-care is content stored at top of said memory cell in each said block.

8. The method of using a hierarchical search-line scheme for search according to claim 7, wherein each said hierarchical search-line group is connected to a same column of same said block.

9. The method of using a hierarchical search-line scheme for search according to claim 7, wherein the data with a longest prefix in said block is stored at bottom of said memory cell, and data with a shortest prefix is stored at top of said memory cell.

10. The method of using a hierarchical search-line scheme for search according to claim 7, wherein said states of don't-care are used as control signals of said buffer.

11. The method of using a hierarchical search-line scheme for search according to claim 7, wherein said buffer is constructed by NOR gate.

* * * * *